(12) United States Patent
Burn et al.

(10) Patent No.: US 10,994,469 B2
(45) Date of Patent: May 4, 2021

(54) DENDRIMER LASER

(71) Applicants: The University Court of the University of St. Andrews, St. Andrews (GB); Oxford University Innovation Limited, Oxford (GB)

(72) Inventors: Paul Burn, St. Lucia (AU); Ifor Samuel, North Haugh (GB); Justin Lawrence, Gwynedd (IE); Jonathan Markham, Berkshire (GB)

(73) Assignees: THE UNIVERSITY COURT OF THE UNIVERSITY OF ST. ANDREWS, St. Andrews (GB); OXFORD UNIVERSITY INNOVATION LIMITED, Oxford (GB)

( * ) Notice: Subject to any disclaimer, the term of this patent is extended or adjusted under 35 U.S.C. 154(b) by 508 days.

(21) Appl. No.: 15/874,498

(22) Filed: Jan. 18, 2018

(65) Prior Publication Data

US 2018/0205202 A1    Jul. 19, 2018

Related U.S. Application Data

(63) Continuation of application No. 11/915,785, filed as application No. PCT/GB2006/002025 on Jun. 2, 2006, now abandoned.

(30) Foreign Application Priority Data

Jun. 30, 2005   (GB) ..................................... 0511294

(51) Int. Cl.
*B29C 59/00*    (2006.01)
*C08G 83/00*    (2006.01)
(Continued)

(52) U.S. Cl.
CPC .......... *B29C 59/005* (2013.01); *C08G 83/003* (2013.01); *H01S 5/36* (2013.01);
(Continued)

(58) Field of Classification Search
CPC ....... H01S 5/12; H01L 51/0095; H01L 51/50; C08G 83/003; B29C 43/003;
(Continued)

(56) References Cited

U.S. PATENT DOCUMENTS

| 6,703,780 B2 | 3/2004 | Shiang et al. |
| 2003/0068525 A1 | 4/2003 | Bellmann et al. |

(Continued)

FOREIGN PATENT DOCUMENTS

| GB | 2361356 A | 10/2001 |
| WO | 2002067343 | 8/2002 |

OTHER PUBLICATIONS

Lawrence et al., Polymer laser fabricated by simple micromolding process, App. Phy. Lett. vol. 82, No. 23, 4023-4025, 2003. (Year: 2003).*

(Continued)

*Primary Examiner* — Atul P. Khare
(74) *Attorney, Agent, or Firm* — Tarolli, Sundheim, Covell & Tummino LLP (57) ABSTRACT

A distributed feedback laser having a conjugated dendrimer as the active lasing component, and a method for patterning conjugated dendrimers.

8 Claims, 6 Drawing Sheets

(51) Int. Cl.
*H01S 5/36* (2006.01)
*H01S 5/04* (2006.01)
*H01S 5/12* (2021.01)
*B29C 59/02* (2006.01)

(52) U.S. Cl.
CPC ......... *B29C 2059/023* (2013.01); *H01S 5/041* (2013.01); *H01S 5/12* (2013.01); *H01S 5/1231* (2013.01)

(58) Field of Classification Search
CPC ... B29C 43/021; B29C 43/023; B29C 59/005; B29C 59/022
See application file for complete search history.

(56) References Cited

U.S. PATENT DOCUMENTS

| | | | | |
|---|---|---|---|---|
| 2004/0137734 | A1* | 7/2004 | Chou | G11B 5/855 438/689 |
| 2004/0169463 | A1* | 9/2004 | Burn | H01L 51/0068 313/504 |
| 2005/0029931 | A1 | 2/2005 | King et al. | |
| 2005/0116622 | A1 | 6/2005 | Lo et al. | |
| 2008/0259987 | A1 | 10/2008 | Smith | |

OTHER PUBLICATIONS

Lawrence et al., Optical amplification in a first-generation dendritic organic semiconductor, Optics Lett., vol. 29, No. 8, 869-871, 2004. (Year: 2004).*
Li, et al, "High-Resolution Contact Printing With Dendrimers", Nano, Lett. vol. 2, No. 4, 347-49 (2002).
Chou et al. "Imprint Lithography with Sub-10 nm Feature Size and High Throughput" Microelectronic Engineering 35 (1997) 237-240.
Lawrence JR, et al: "Optical Amplification in a First-Generation Dendritic Organic Semiconductor"; Optics Letter [Online]; vol. 29, No. 8, Apr. 15, 2004; pp. 869-871, XP002390980, ISSN: 0146-9592; Retrieved from the Internet: URL: http://www.opticsinfobase.org/abstracct.cfm?URI=OL-29-8-869> [retrieved on Jul. 11, 2006] p. 869-870.
Otomo Akira et al.: "Supernarrowing Mirrorless Laser Emission in Dendrimer-Doped Polymer Waveguides"; Applied Physics Letters, AIP, American Institute of Physics, Melville, NY, US, vol. 77, No. 24, Dec. 11, 2000, pp. 3881-3883, XP012026860, ISSN: 0003-6951, p. 3381; Fig. 1.
Otomo A et al.: "Remarkable Optical Properties of Dendrimers for Laser Applications"; Linear and Nonlinear Optics of Organic Materials Aug. 1-2, 2001, San Diego, CA, USA, vol. 4461, Aug. 2001, pp. 180-187, XP002390981, Proceedings of the SPIE—The International Society for Optical Engineering SPIE—Int. Soc. Opt. Eng USA, ISSN: 0277-786X, p. 181, line 4-5; Fig. 1; Abstract.
Kim E, et al.: "Solvent-Assisted Microcontact Molding: A Convenient Method for Fabricating Three-Dimensional Structures on Surfaces of Polymers"; Advanced Materials, Wiley VCH, Weinheim, DE, vol. 9, No. 8, Jun. 1997, p. 651, right-hand column—p. 652,left-hand column.
Markham, J P J, et al.: "Efficient Electrophosphorescent Dendrimer LEDs"; LEOS 2002. 15th. Annual Meeting of the IEEE Lasers & Electro-Optics Society. GLascow, Scotland, Nov. 11-12, 2002, Annual Meeting of the IEEE Lasers and Electro-Optics Society, New York, NY: IEEE, US, vol. 1 of 2, Nov. 11, 2002, pp. 195-196, XP010620478, ISBN: 0-7803-7500-9, p. 195.
Lawrence, Justin R, et al.: "Polymer Laser Fabricated by a Simple Micromolding Process"; Applied Physics Letters, AIP, American Institute of Physics, Melville, NY, US, vol. 82, No. 23, Jun. 9, 2003, pp. 4023-4025, XP012034298, ISSN: 0003-6951, p. 4023, right-hand column—p. 4024, left-hand column.
International Search Report for PCT/GB2006/002025, completed Jul. 19, 2006 by D. Meacher of the EPO.
Namdas, Ebinazar, et al.: "Simple Color Tuning of Phosphorescent Dendrimer Light Emitting Diodes"; Applied Physics Letters, AIP, American Institute of Physics, Melville, NY, US, vol. 86, No. 16, Apr. 11, 2005, pp. 161104-161104, XP012065079, ISSN: 0003-6951, Abstract.
Markham, Jonathan, et al.: "Tuning of Emission Color for Blue Dendrimer Blend Light-Emitting Diodes"; Applied Physics Letters, AIP, American Institute of Physics, Melville, NY, US, vol. 85, No. 9, Aug. 30, 2004, pp. 1463-1465, XP012064326, ISSN: 0003-6951, p. 1463, righthand column, line 2—p. 1464, left-hand column, line 3.

* cited by examiner

Ir-G1; R=ethylhexyl      CBP      TPBI

Figure 8

DENDRIMER LASER

The present invention relates to a dendrimer laser and a method for making the same. The invention also relates to a method for physically patterning a film comprised of a dendrimer.

BACKGROUND OF THE INVENTION

Organic semiconductors are proving to be very successful alternatives to inorganic materials for a range of optoelectronic applications. Most notably, there has been remarkable progress in organic semiconductor based light-emitting displays and lasers. One known organic semiconductor laser is a polymer distributed feedback laser, which is essentially a corrugated surface coated with a thin film of polymer.

Polymer distributed feedback (DFB) lasers are usually made by spin-coating a polymer onto a corrugated substrate, see G. A. Turnbull, P. Andrew, M. J. Jory, W. L. Barnes, I. D. W. Samuel, *Physical Review B*, 64, 5122, (2001). The period of the corrugation is designed to give optical feedback at the wavelength of the highest gain in the laser material. The corrugated substrates are normally made by either electron beam lithography or interference photolithography. However, these suffer from various disadvantages. Electron beam lithography requires expensive equipment, is time consuming and can only pattern small areas. Interference photolithography has limited resolution due to the diffraction limit of light used. In addition, both techniques require a reactive ion-etching step involving hazardous gases to etch the corrugation into the silica substrate.

To overcome some of the difficulties associated with more conventional techniques so called soft lithography techniques have been used to fabricate distributed feedback polymer lasers. Soft lithography is a family of techniques that use elastomeric moulds to transfer patterns to polymers, Y. Xia, G. M. Whitesides, *Angewandte Chemie*, 37, 551, (1998). Work to date has centred on demonstrating these techniques mainly in polymers such as PVA or PMMA or by printing self assembled monolayers onto metal films. Soft lithography has been used to form a conjugated polymer DFB laser, see J. R. Lawrence, G. A. Turnbull, I. D. W. Samuel, *Applied Physics Letters*, 82, 4023, (2003). This structure had a period of 400 nm and a depth of 20 nm and was formed using a mould made from PDMS, which is a standard elastomeric material. The patterned film was optically pumped and showed lasing above a threshold of 225 nJ, though only with a low slope efficiency of 0.4%.

As well as polymers, other organic materials have been used in lasers. For example, non-fluorescent and electrically insulating dendrimers have been used as a host to separate molecules of a conventional laser dye in order to prevent aggregation, S. Yokohama, A. Otomo, S. Mashiko, *Applied Physics Letters*, 80, 7, (2002). Also laser-like emission from a polymer waveguide doped with a rhodamine-cored electrically insulating dendrimer has been reported, see A. Otomo, S. Yokohama, T. Nakahama, S. Mashiko, *Applied Physics Letters*, 77, 2881, (2000). However, whilst known organic semiconductor lasers provide many opportunities and advantages, tuning of electrical, processing and device properties is not always straightforward. In fact, previous attempts to tune the solubility of semiconducting polymers have led to undesirable changes in the emission properties. These issues can be overcome in conjugated dendrimers. However, in spite of such materials being known for a decade, and optical gain having been observed in them, lasing has not been observed.

SUMMARY OF THE INVENTION

According to one aspect of the present invention, there is provided a solid state laser having a conjugated dendrimer as a lasing medium. Preferably, the conjugated dendrimer is a second or higher generation dendrimer. Preferably, the laser is a distributed feedback laser that has wavelength scale surface corrugations.

Using a conjugated dendrimer as the active lasing medium provides many advantages. Light-emitting dendrimers have a modular macromolecular architecture generally consisting of a core, a plurality of dendrons, each of which can contain conjugated units, and solubility conferring surface groups at the distal ends of the dendrons which provide solubility in solvents used for solution processing, especially solution processing as used for forming thin films. Suitable solvents are typically polar aprotic solvents. Surface groups can also be chosen so that after patterning they can be further reacted to cross-link the materials. For example, oxetane containing surface groups can be cross-linked by a photo-generated acid. The modular architecture of dendrimers allows for independent tuning of the electrical, optical and processing properties. This can be done by, for example, varying the generation of the dendrimer. The dendritic structure also allows for a wide range of emissive chromophores that in many cases would be unsuited for use in an unmodified form or as a repeat unit of a polymer, for one reason or another, e.g. because of luminescence-quenching interactions A wide range of fluorescent conjugated dendrimers can be used to make lasers. Examples of such materials can be found in WO02/067343 and WO99/21935, the contents of which are incorporated herein by reference thereto. In particular, conjugated dendrimers with high fluorescence quantum yield in the solid state are preferred. One example is a conjugated dendrimer with 2-ethylhexyloxy surface groups, biphenyl dendrons and a bisfluorene core. The conjugated dendrimer may be a first, second or higher generation dendrimers, although second generation dendrimers are preferred. Where fluorene units are part of the core and/or dendron and/or surface groups, they are preferably substituted at the 9-position in order to minimise photooxidation at the carbon atoms thereof. Suitable substituents include alkyl, aryl, and alkoxy.

The lasing medium may comprise a single conjugated dendrimer species. Alternatively, a plurality of different conjugated dendrimers may be used.

According to another aspect of the invention, there is provided a method for physically patterning a film containing a dendrimer comprising applying a suitable mould to a layer of dendrimer thereby to imprint a pattern therein. The pattern may be a distributed feedback structure for use in a laser. The patterned structure may also be used in other device applications including light-emitting diodes, photovoltaic devices, photodiode devices and field effect transistors. This method of patterning is suitable for both fluorescent and phosphorescent dendrimers (examples of which are given in WO02/067343, WO99/21935, WO02/066552 and S.-C. Lo et al Advanced Materials 14, 975 (2002), the contents of which are incorporated herein by reference).

Preferably, the mould is made of an elastomeric material. For example, the mould may be made from a liquid copolymer including vinylmethylsiloxane-dimethylsiloxane (VDT) and methylhydrosilane-dimethylsiloxane (HMS), more specifically a liquid copolymer including 3.4 parts vinylmethylsiloxane-dimethylsiloxane (VDT) and 1 part methylhydrosilane-dimethylsiloxane (HMS).

Preferably, a softening chemical is applied to the mould either prior to or simultaneously with applying the mould to the dendrimer film. In general, suitable softening chemicals are solvents in which the dendrimer is soluble or at least partially soluble. Polar aprotic solvents such as chloroform, toluene, tetrahydrofuran and dichloromethane could be used as the softening chemical.

According to yet another aspect of the present invention, there is provided a patterned dendrimer film that is patterned using a mould. Preferably the mould is made of an elastomeric material, for example vinylmethylsiloxane-dimethylsiloxane (VDT) and/or methylhydrosilane-dimethylsiloxane (HMS).

Figure 1:
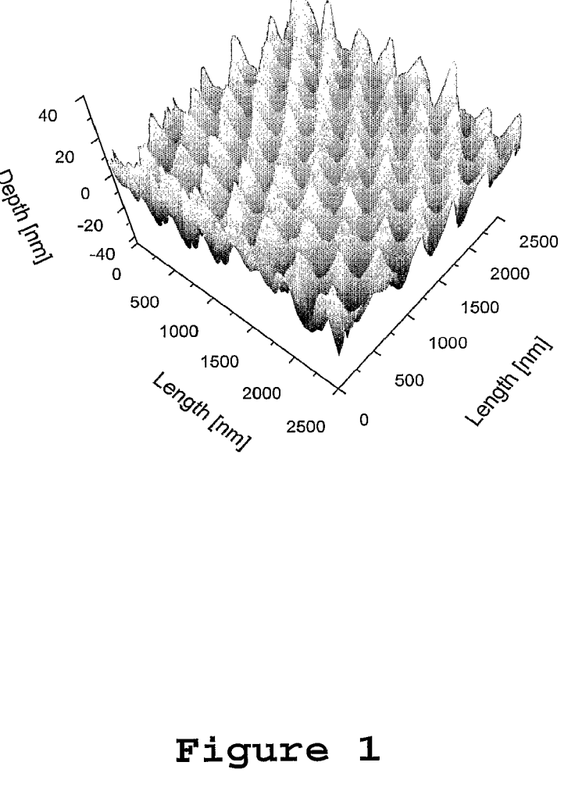
FIG. 1 is an atomic force microscope image of a dendrimer film patterned by solvent assisted micromoulding to make a distributed feedback laser.

Various aspects of the invention will now be described by way of example only and with reference to the accompanying drawings, of which:

FIG. 1 shows an atomic force microscope image of a film of a conjugated dendrimer patterned by solvent assisted micromoulding to make a distributed feedback laser. Conjugated dendrimers typically have the formula (I):

CORE-[DENDRON]$_n$ in which CORE represents an atom or group, n represents an integer of at least one, and DENDRON, which may be the same or different if n is greater than one represents a dendritic molecular structure, CORE terminating in the single bond to the first branching atom or group with more than one dendritic chain attached, said atom or group forming part of said DENDRON, with at least one DENDRON at least inherently partially conjugated. For example, for the materials in FIG. 2, the core consists of the two fluorene units at the centre of the molecule. At each end it terminates at the single bonds to the phenyl rings that are the first branching point of the dendron, i.e. the phenyl rings adjacent to the fluorene core are considered part of the dendron.

Cores can be an atom such as C, N or Si, or a group comprised of one or more (hetero)aryl units such as fluorene, benzene, thiophene, pyridine, or complexes containing a metal such as tris(hydroxyquinolate)aluminium(III) and fac-tris(2-phenylpyridyl)iridium (III). When (hetero)aryl units are used in the core they can have substituents attached to optimise their properties. For example fluorene units can have two alkyl groups attached to the 9-position, which enhances processing and stability. Such variations and optimisations are known to those skilled in the art. The (hetero)aryl units within the core can be either bonded directly to each other or linked by alkenyl and/or acetylenyl units. The core is preferably luminescent but when the core is not luminescent then the dendrons must contain at least one luminescent moiety. Depending on the application either fluorescent or phosphorescent moieties may be preferred. For example, for lasing fluorescent dendrimers are preferred whereas for light-emitting diodes phosphorescent dendrimers are preferred. For lasing applications it is preferred when the core is luminescent that it has a smaller HOMO-LUMO energy gap than any chromophores in the dendron(s). It should be noted that the chromophore within the dendrimer of smallest HOMO-LUMO energy gap may contain units of the core and the first branching point in the dendron(s).

Dendrons are comprised of branching units and, optionally, linking units. The generation of a dendron is defined by the number of sets of branching units in the dendron. In a second generation dendron, there is a first branching unit, and each of the branches stemming from that first branching unit then branches again ("the second branching units"). In a third generation dendron, each of the branches stemming from the second branching units would themselves branch again, and so on for higher generation dendrons. Suitable branching units include aryl and heteroaryl, which can be fused, and N. It should be noted that an N-containing fused heteroaryl ring such as carbazole can be considered a branching point. The links between branching points include bonding combinations such as aryl-aryl, aryl-vinyl-aryl, aryl-acetylenyl-aryl, aryl-aryl'-aryl (where aryl' may be different from aryl), N-aryl and N-aryl'-N where aryl and N are branching units.

Preferred linking units include phenyl and fluorenyl. An individual dendron may contain one or more of each type of branching point. Moreover, in the case of the aryl-vinyl-aryl and aryl-acetylenyl-aryl linkages within the dendron there may be one or more aryl-vinyl or aryl-acetylenyl link between the branching points. Indeed there may be more than one vinyl or acetylenyl or aryl moiety between two aryl branching units but preferably no more than three. Further, there can be advantages in using an asymmetric dendrimer i.e. where the dendrons are not all the same. The dendrons in a asymmetric dendrimer can vary in generation and/or composition. A dendron can be considered at least inherently partially conjugated when it contains alternating double and single bonds and/or lone pairs which are in conjugation but due to the regiochemistry of the connectivity the electrons in the p-orbitals are not fully delocalised (M. Halim; J. N. G. Pillow, I. D. W. Samuel and P. L. Burn *Advanced Materials* 11, 371 (1999)). For example, with the first generation dendrimer in FIG. 2 the phenyl units of the dendrons and the core are fully conjugated. However, the electrons in the p-orbital are not fully delocalised in the dendrimer due to the meta linking arrangement of the groups around the branching phenyl rings.

Surface groups can be attached to the distal ends of the dendrons. For example, surface groups could be attached to aid solubility.

Suitable surface groups for the dendrimers that could be attached to the distal (hetero)aryl group include branched and unbranched alkyl, especially t-butyl, branched and unbranched alkoxy, for example 2-ethylhexyloxy, hydroxy, alkylsilane, carboxy, carbalkoxy, and vinyl. A more comprehensive list includes a further-reactable alkene, (meth) acrylate, sulphur-containing, or silicon-containing group; sulphonyl group; polyether group; $C_1$-$C_{15}$ alkyl (preferably t-butyl) group; amine group; mono-, di- or tri-$C_1$-to-$C_{15}$ alkyl amine group; —COOR group wherein R is hydrogen or $C_1$-to-$C_{15}$ alkyl; —OR group wherein R is hydrogen, aryl, or $C_1$-to-$C_{15}$ alkyl or alkenyl; —$O_2$SR group wherein R is $C_1$-to-$C_{15}$ alkyl or alkenyl; —SR group wherein R is aryl, or $C_1$-to-$C_{15}$ alkyl or alkenyl; —SiR, group wherein the R groups are the same or different and are hydrogen; $C_1$-to-$C_{15}$ alkyl or alkenyl, or —SR' group (R' is aryl or $C_1$-to-$C_{15}$ alkyl or alkenyl), aryl, or heteroaryl. Typically t-butyl and alkoxy are used. Different surface groups may be present on different dendrons or different distal groups of a dendron. Surface groups may be present on the dendron, which comprises the N atom, which forms part of an aromatic group or is attached to at least two aromatic groups. It is preferred that the dendrimer is solution processable i.e. the surface groups are such that the dendrimer can be dissolved in a solvent.

The surface group can be chosen such that the dendrimer can be processed to the required form, for example a thin film. It is preferred that the surface groups are groups which contain at least two carbon atoms, for example $C_2$-$C_{15}$ alkyl or OR where R is aryl or $C_2$-$C_{15}$ alkyl or alkenyl. More preferably, the surface groups will contain 4 or more carbons for example tert-butyl. In addition, the surface group can be chosen such that the dendrimer can be patterned. For example, a cross-linkable group is present which can be cross-linked upon irradiation or by chemical reaction. Alternatively the surface group may comprise a protecting group that can be removed to leave a group that can be cross-linked. In general, the surface groups are selected so the dendrimers are soluble in solvents suitable for solution processing.

Figure 2A:
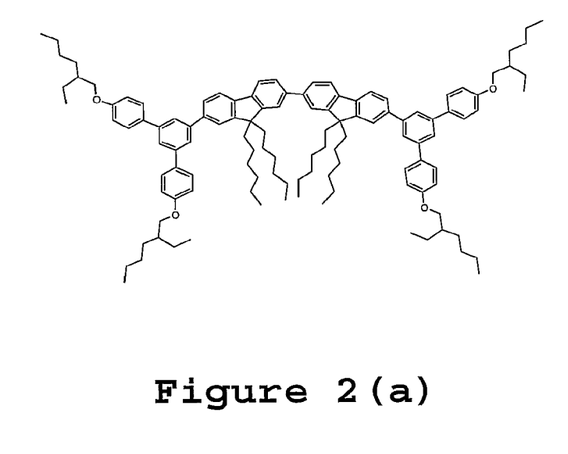
FIG. 2 shows the chemical structure of first generation G1 (top) and second generation G2 (bottom) bisfluorene cored dendrimers with biphenyl dendrons and 2-ethylhexyloxy surface groups. The fluorenes have two alkyl groups on the 9-position.
Figure 2B:
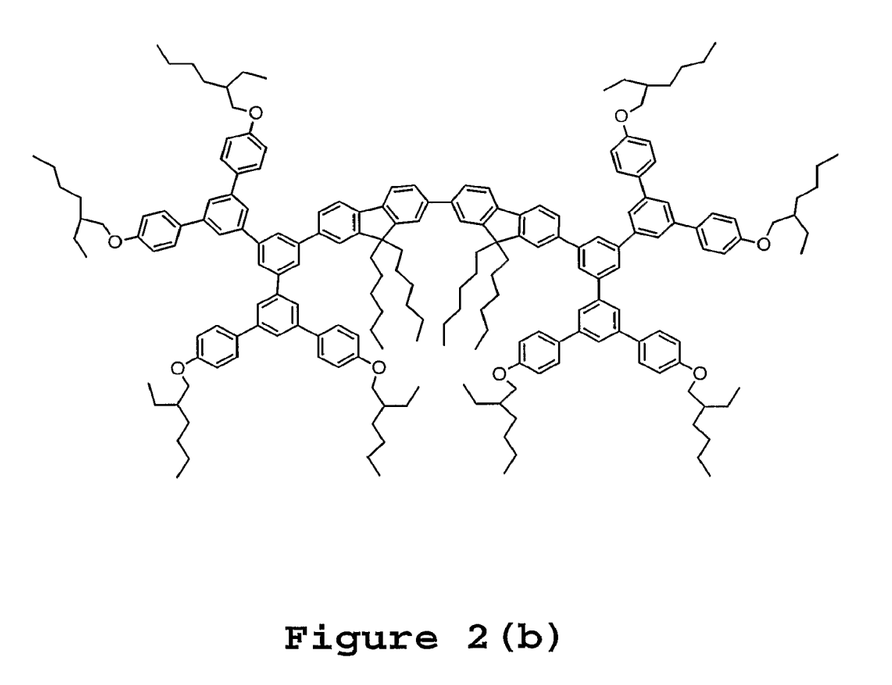

The chemical structures of first and second-generation bisfluorene cored dendrimers G1 and G2 are shown in FIGS. 2(a) and (b) respectively. The dendrimers have two hexyl groups attached in the 9 position of each fluorene unit of the core. Phenylene based dendrons with 2-ethylhexyloxy surface groups are attached to the core. The dendrimer containing one level of branching is the first generation (G1) while two levels of branching gives the second-generation (G2) dendrimer.

Figure 3:
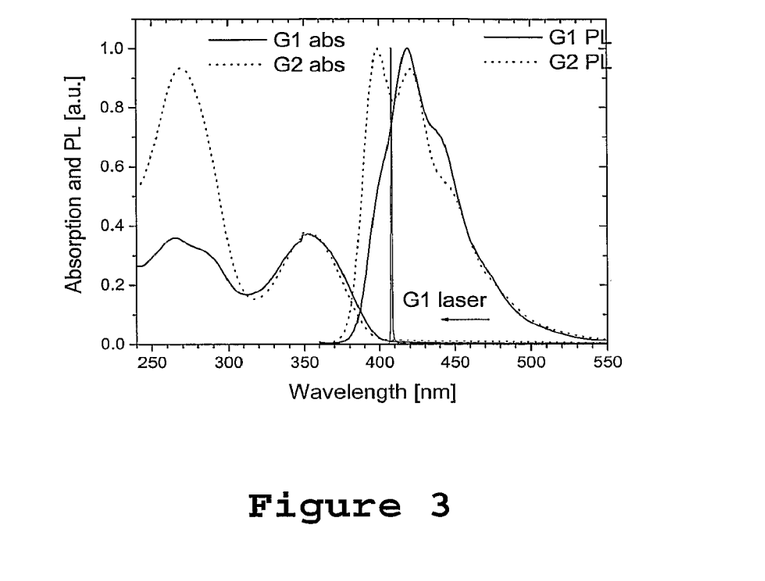
FIG. 3 shows photoluminescence and absorption spectra of thin films of the dendrimers of FIG. 2. In addition it shows the spectrum of a laser made from the first generation material.

The photoluminescence and absorption spectra of thin films of the dendrimers of FIG. 2 are shown in FIG. 3. The absorption spectra of G1 (solid line) and G2 (dotted lines) show an intense band peaking at 350 nm. This is due to the bis-fluorene bis-phenylene unit at the core of the molecule. The absorption in the region of 250-300 nm peaking at 270 nm is primarily due to the biphenylene based dendrons. A further increase of the UV absorption band peaking at 270 nm is observed in G2 due to the increase in the number of biphenylene dendron units. The PL spectrum of the neat G1 and G2 film is also shown in FIG. 3. The PL has peaks at 400 nm, 420 nm and 440 nm respectively. The solid state photoluminescence quantum yield (PLQY) of G1 and G2 bisfluorene were found to be 42% and 75% respectively. The higher PLQY of the G2 arises from the greater separation of the bis-fluorene cores i.e. the addition of extra dendrons reduces the intermolecular interactions. The values for G2 are higher than for most conjugated polymers. Higher PLQYs are an advantage for laser materials.

To test the performance of dendrimers as DFB lasers, various devices were fabricated. A first set of devices was fabricated by spin coating a dendrimer solution onto a corrugated etched silica substrate. Another set of devices was fabricated using a piece of corrugated etched silica as a master for a micromoulding process. To allow for a direct comparison between the micromoulded and corrugated substrate-based lasers, the same piece of corrugated etched silica was used for both processes. The corrugation in the silica was defined holographically in photoresist layers on silica substrates. Subsequent development of the photoresist and reactive-ion etching into the silica formed the final grating structure. This had a period of 270 nm and a depth of 85 nm. This period was chosen to provide both distributed feedback and surface output coupling.

Micromoulded lasers were formed by spin coating G2 dendrimer from 20 g/l chloroform solutions onto glass substrates, resulting in films of about 120 nm in thickness. These films were patterned using an elastomeric mould to transfer the desired pattern from the etched silica master to the dendrimer film. To form the mould, a liquid co-polymer, 3.4 parts vinylmethylsiloxane-dimethylsiloxane (VDT) and 1 part methylhydrosilane-dimethylsiloxane (HMS) was poured over the master, i.e. the piece of etched silica substrate, and allowed to cure for 48 hours. The cured elastomer was separated from the master. This cured part will be referred to as the "stamp". This was then inked by using a Q-tip to apply a small amount of chloroform. The spin-coated dendrimer film was placed in contact with the inked stamp. This was achieved by hand-holding the stamp and dendrimer film together. It was not necessary to apply significant pressure. As the stamp material was elastomeric, conformal contact was easily made with the dendrimer film. The solvent on the stamp dissolved the dendrimer, allowing it to flow around the microstructure and conform to its shape. After allowing the solvent to evaporate (and/or soak into the mould), the mould was removed from the dendrimer film. A typical time between applying the mould and removing it was two minutes.

Figure 4:
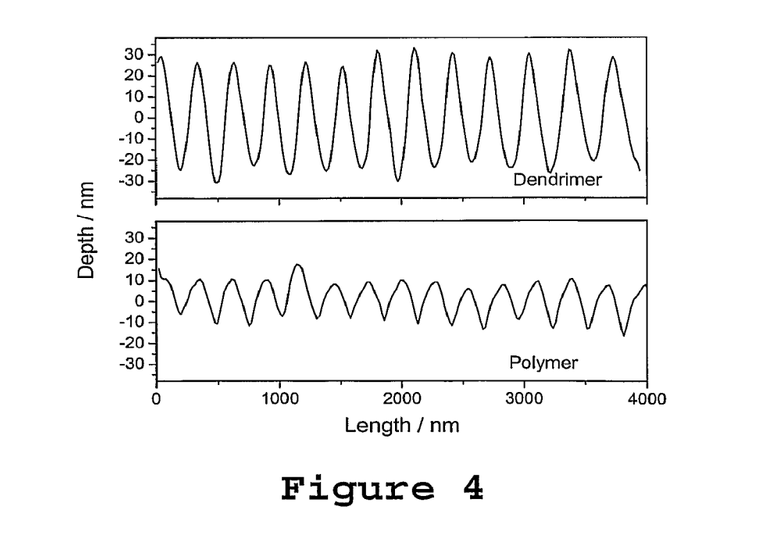
FIG. 4 shows plots of the corrugation profile for structures in polymer (bottom) and bis-fluorene dendrimer (top)

Whilst micro-moulding has been used for making DFB polymer lasers, it was found unexpectedly that deeper structures having shorter periods can be formed in dendrimers than in polymers. For example, at a period of 270 nm dendrimers can be moulded to a depth of 50-60 nm while for the same stamp, the conjugated polymer ($OC_1C_{10}$-PPV) structure is at most 25 nm deep, see FIG. 4. It is believed that this is due to the fact that polymers are long chain macromolecules, which do not flow as easily as the branched dendrimer macromolecules. The dendrimer is also more soluble than the conjugated polymer, which should mean the time needed to mould the dendrimer is shorter.

Figure 5:
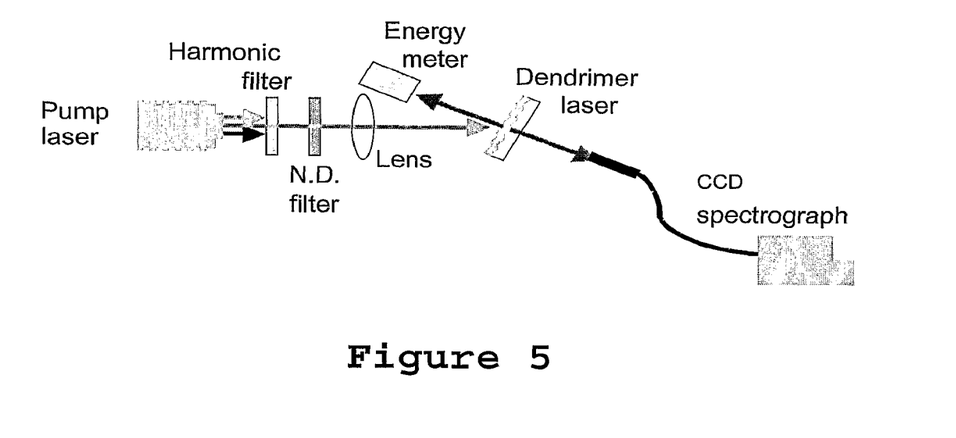
FIG. 5 is a schematic diagram of an experimental set-up for testing a dendrimer laser.

FIG. 5 shows a set-up for testing the lasers formed using both the coated substrate and micro-moulding techniques. This includes a pump laser, a series of filters, a lens and a vacuum chamber. For monitoring the dendrimer laser output, an energy meter and a fibre-coupled CCD spectrograph were also provided. The dendrimer lasers were mounted in a vacuum chamber and held under a pressure of $10^{-4}$ mbar to isolate them from oxygen and water. The films were optically pumped using a frequency-doubled passively Q-switched Nd:YVO$_4$ microchip laser, which produced 1 ns pulses at 355 nm with a repetition rate of 5 kHz. The output of the pump laser was attenuated using neutral density filters then focused using a 63 mm focal length spherical lens to a spot of half width 100 μm (horizontal) by 80 μm (vertical). The pump beam was aligned at 20° to the film normal. The spectral output and the output energy from the films were measured in a direction close to normal incidence using the fibre-coupled CCD spectrograph.

Figure 6:
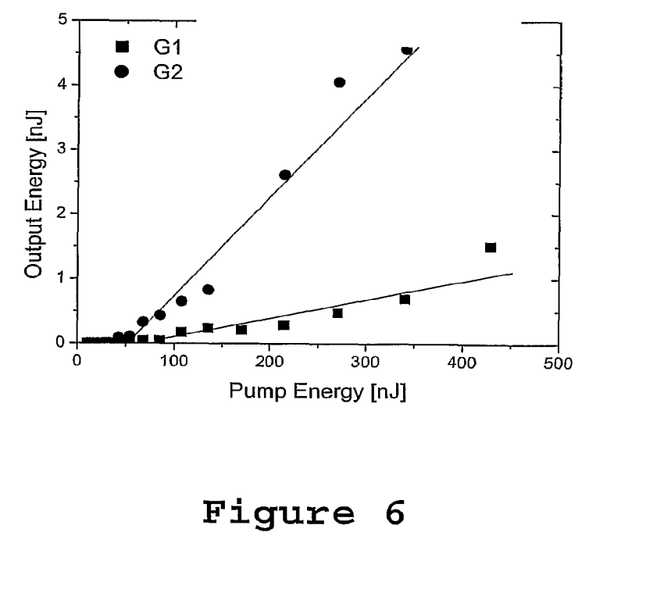
FIG. 6 is a plot of threshold and slope efficiency for G1 and G2 dendrimer lasers fabricated using a first technique.

FIG. 6 shows the performance of two dendrimer DFB lasers fabricated by coating etched silica substrates, one having a G1 dendrimer layer and the other having a G2 dendrimer layer. In each case, the dendrimer film thickness before patterning was 120 nm, and the grating had a period of 270 nm and a depth of 50-60 nm. The shape of the grating is shown in FIG. 1. In this case, the period of the grating is defined as the (smallest) distance over which the structure repeats, i.e. the distance from one peak to the nearest peak. The depth is the typical distance from the top of a peak to the bottom of the adjacent trough.

When the G1 dendrimer laser was pumped above threshold the emission spectrum narrowed to a peak at 408 nm and had a detection-limited full width at half maximum (FWHM) linewidth of 0.7 nm. The laser threshold was 90 nJ, the maximum output energy was 1.6 nJ and the slope efficiency was 0.3%. The peak of the emission from the G2 dendrimer laser was at 408 nm and had a FWHM linewidth of 0.8 nm. In this case, however, the laser threshold was 50 nJ, the maximum output energy obtained was 4.5 nJ and the slope efficiency was 1.6%. Hence, the G2 dendrimer lased at the same wavelength as the G1 but had a lower threshold, higher output power and higher slope efficiency. This improvement in performance demonstrates the benefits of the dendritic structure and higher generation.

Figure 7:
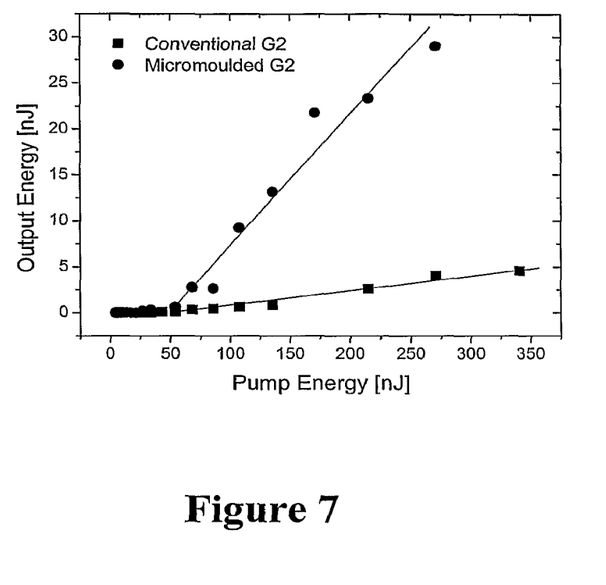
FIG. 7 is a plot of slope efficiency for two G2 dendrimer lasers, each made using a different technique.

FIG. 7 shows the performance of two dendrimer DFB lasers, both having a G2 dendrimer as the active layer, but one being fabricated using micromoulding and the other being fabricated using an etched substrate. In this case, the micromoulded laser has a slope efficiency of 14%, which is higher than that of the etched silica-grating laser, 1.6%. This value of 14% is almost twice that obtained for conventional DFB lasers using conjugated polymers such as polyfluorene (7.8%) and MEH-PPV (6.8%), see G. Heliots, R. Xia, G. A. Turnbull, P. Andrew, W. L. Barnes, I. D. W. Samuel, *Advanced Functional Materials*, 14, 91, (2004), and G. A. Turnbull, P. Andrew, W. L. Barnes, I. D. W. Samuel, *Applied Physics Letters*, 82, 313, (2003). This demonstrates the advantage of using a dendrimer as the laser material, and of patterning it with a mould as described. The improvement in performance between G1 and G2 suggests that in dendrimers generation number is a useful way of optimising laser performance.

The performance of this micromoulded dendrimer device is also much better than the micromoulded conjugated polymer device described by J. R. Lawrence, G. A. Turnbull, I. D. W. Samuel, in *Applied Physics Letters*, 82, 4023, (2003). In particular, the threshold of the dendrimer laser is lower (50 nJ compared to 225 nJ) and the slope efficiency is higher (14% compared to 0.4%). The lower refractive index of the dendrimer compared to conjugated polymers allow allows better interaction between the laser mode in the film and the micromoulded grating.

Figure 8:
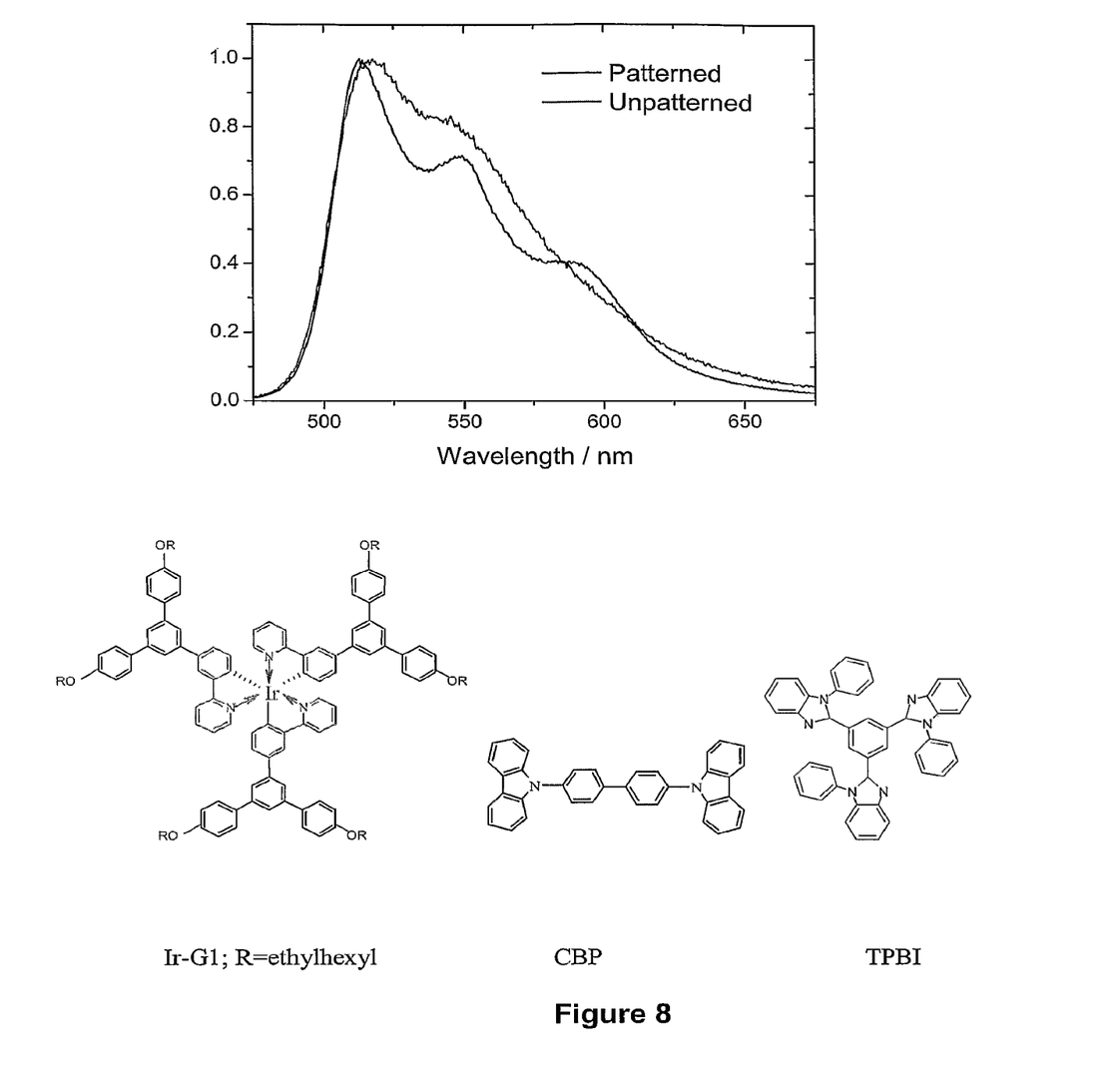
FIG. 8 shows the electroluminescence spectra of two dendrimer LEDs, together with the chemical structures of the constituent organic semiconductors. One LED was patterned by the solvent assisted process described in this patent application; the other was not. The spectra have been normalised to the same peak intensity.

It is evident that the patterning process for dendrimers described above, is applicable to a range of dendrimer electronic and optoelectronic devices. An example is a light emitting diode incorporating wavelength scale microstructure. Such microstructure could be used to modify the emission and/or increase efficiency of light extraction from the device. The emission spectrum of a dendrimer LED in which the dendrimer has been patterned by solvent assisted micromoulding is shown in FIG. 8. An unpatterned device is shown for comparison. The pattern is a corrugation with a period of 340 nm. The dendrimer LED consisted of an indium tin oxide (ITO) coated glass substrate, which was cleaned by ultrasound in acetone and then isopropanol followed by oxygen plasma ashing. A dendrimer blend layer of thickness 100 nm was deposited by spin coating. The dendrimer blend layer consisted of an iridium (III) tris phenylpyridine cored dendrimer (Ir-G1), TPBI and CBP, in a ratio of 1:2:2 by weight. The structures of the constituents of the blend are also shown in FIG. 8. After patterning, the device was completed by thermal evaporation of a cathode on top of the dendrimer blend layer. The cathode consisted of 1 nm LiF followed by 100 nm of aluminium.

When a voltage in the range 5-10 V was applied to the LED described with reference to FIG. 8, green light emission was seen. This is significant, as the corrugation introduced might have been expected to cause shorting of the device under the strong electric field applied. However, the results show that working LEDs incorporating wavelength scale corrugation can readily be made. For comparison the emission spectrum of a similar LED in which the dendrimer blend layer was not patterned is shown. LEDs could also be made with a calcium/aluminium cathode and with electron and hole transporting layers. Similar structures are also capable of use as solar cells and photodiodes.

A skilled person will appreciate that variations of the disclosed arrangements are possible without departing from the invention. Accordingly, the above description of the specific embodiment is made by way of example only and not for the purposes of limitation. It will be clear to the skilled person that minor modifications may be made without significant changes to the operation described.

The invention claimed is:

1. A light emitting diode (LED) fabrication method comprising:
   patterning a film containing a dendrimer, wherein the dendrimer has the formula:

CORE-[DENDRON]$_n$ in which CORE represents an atom or group, n represents an integer of at least one, and DENDRON, which may be the same or different if n is greater than one, represents a dendritic molecular structure, CORE terminating in single bond to a first branching atom or group of said DENDRON structure with more than one dendritic chain of said DENDRON structure attached, with at least one of said DENDRON structure at least inherently partially conjugated,
   wherein patterning the film involves applying a mould having a softening fluid applied thereto to the dendrimer film to form a corrugated surface pattern having a depth of 50-60 nm in the film, thereby to fabricate a light emitting diode, and
   wherein distal ends of the DENDRON structure comprise solubility conferring groups selected to provide solubility of the dendrimer in the softening fluid during said patterning.

2. An LED fabrication method as claimed in claim 1, wherein the film consists only of the dendrimer.

3. An LED fabrication method as claimed in claim 1, further comprising applying the softening fluid to the mould prior to applying the mould to the dendrimer film.

4. An LED fabrication method as claimed in claim 1, wherein the dendrimer is a second or higher generation dendrimer.

5. An LED fabrication method as claimed in claim 1, wherein the CORE comprises a bisfluorene CORE.

6. An LED fabrication method as claimed in claim 1, wherein the dendrimer is processed from solution to form the film.

7. An LED fabrication method as claimed in claim 1, wherein a period of the corrugated pattern is 270 nm.

8. An LED fabrication method as claimed in claim 1, wherein the softening fluid is a solvent in which the dendrimer is soluble or at least partially soluble.

* * * * *